United States Patent
Jenq et al.

(10) Patent No.: US 6,967,870 B2
(45) Date of Patent: Nov. 22, 2005

(54) COMBINATION NAND-NOR MEMORY DEVICE

(75) Inventors: Ching-Shi Jenq, Los Altos Hills, CA (US); Tien-Ler Lin, Saratoga, CA (US)

(73) Assignee: Integrated Memory Technologies, Inc., Santa Clara, CA (US)

( * ) Notice: Subject to any disclaimer, the term of this patent is extended or adjusted under 35 U.S.C. 154(b) by 0 days.

(21) Appl. No.: 10/753,644

(22) Filed: Jan. 7, 2004

(65) Prior Publication Data
US 2005/0146936 A1 Jul. 7, 2005

(51) Int. Cl.[7] .............................................. G11C 16/04
(52) U.S. Cl. ..................... 365/185.17; 365/185.12; 365/185.29
(58) Field of Search ............... 365/185.17, 185.29, 365/185.33, 238.5, 185.11, 185.12

(56) References Cited

U.S. PATENT DOCUMENTS

| | | | | |
|---|---|---|---|---|
| 4,949,309 A | * | 8/1990 | Rao | 365/185.12 |
| 5,668,757 A | | 9/1997 | Jeng | 365/185.1 |
| 5,706,241 A | * | 1/1998 | Nakamura et al. | 365/226 |
| 5,768,215 A | | 6/1998 | Kwon et al. | 365/238.5 |
| 5,777,923 A | * | 7/1998 | Lee et al. | 365/185.11 |
| 6,304,489 B1 | * | 10/2001 | Iwahashi | 365/185.24 |
| 6,469,955 B1 | | 10/2002 | Tsao et al. | 365/238.5 |
| 6,621,735 B2 | * | 9/2003 | Nakamura et al. | 365/185.17 |

* cited by examiner

Primary Examiner—Son Mai
(74) Attorney, Agent, or Firm—DLA Piper Rudnick Gray Cary US LLP

(57) ABSTRACT

An integrated circuit memory device has an array of non-floating gate non-volatile flash cells arranged in a NOR configuration. The device further has page buffers and control circuits to operate the array in either a NAND mode of operation or a NOR mode of operation. Finally, the array is partitionable by a user into two partitions such that one partition operates only in the NAND mode while the other partition operates only in a NOR mode.

20 Claims, 2 Drawing Sheets

```
          PINOUT
        ASSIGNMENT
              VSS   1        44  VCC
     NAND — CLE    2        43  CE# — NAND
     NAND — ALE    3   10   42  RE# — NAND/NOR
   NAND/NOR — WE#  4        41  R/B# — NAND/NOR
   NAND/NOR — WP#  5        40  SE# — NAND/NOR
          ┌ A11 ┐  6        39  ┌ CER# ┐
          │ A10 │  7        38  │ A22  │
          │  A9 │  8  44-PIN 37  │ A21  │
          │  A8 │  9 STANDARD 36  │ A20  │
          │  A7 │ 10  TSOP-II 35  │ A19  │
          │  A6 │ 11        34  │ A18  │ NOR
     NOR  │  A5 │ 12        33  │ A17  │
          │  A4 │ 13        32  │ A16  │
          │  A3 │ 14        31  │ A15  │
          │  A2 │ 15        30  │ A14  │
          │  A1 │ 16        29  │ A13  │
          └  A0 ┘ 17        28  └ A12 ┘
          ┌ I/O 0│ 18        27  ┌ I/O 7 ┐
          │ I/O 1│ 19        26  │ I/O 6 │
 NAND/NOR │ I/O 2│ 20        25  │ I/O 5 │ NAND/NOR
          └ I/O 3│ 21        24  └ I/O 4 ┘
              VSS 22        23  VCCQ
```

PINOUT ASSIGNMENT

```
                    VSS   1           44   VCC
         NAND — CLE       2           43   CE# — NAND
         NAND — ALE       3    10     42   RE# — NAND/NOR
       NAND/NOR — WE#     4           41   R/B# — NAND/NOR
       NAND/NOR — WP#     5           40   SE# — NAND/NOR
                   ⎡A11⎤  6           39   ⎡CER#
                    A10   7           38    A22
                    A9    8  44-PIN   37    A21
                    A8    9  STANDARD 36    A20
                    A7   10  TSOP-II  35    A19
                    A6   11           34    A18    NOR
            NOR     A5   12           33    A17
                    A4   13           32    A16
                    A3   14           31    A15
                    A2   15           30    A14
                    A1   16           29    A13
                   ⎣A0⎦  17           28   ⎣A12
                   ⎡I/O 0⎤ 18         27   ⎡I/O 7
                    I/O 1  19         26    I/O 6
         NAND/NOR   I/O 2  20         25    I/O 5   NAND/NOR
                   ⎣I/O 3⎦ 21         24   ⎣I/O 4
                    VSS   22          23    VCCQ
```

FIG. 1

COMBINATION NAND-NOR MEMORY DEVICE

TECHNICAL FIELD

The present invention relates to a flash memory device which is operable in either a NAND mode of operation or in a NOR mode of operation.

BACKGROUND OF THE INVENTION

Semiconductor non-volatile memories, comprising an array of non-volatile memory cells arranged in a plurality of rows and columns (or bit lines) can be characterized as operating either in a NAND mode of operation or a NOR mode of operation. The reference to NAND or NOR type refers to the manner in which the non-volatile memory cells are arranged in the array and are programmed and read. Typically, NAND memory cells are programmed or read to operate in a page mode manner in which a page of data (typically 512 bytes) is stored in a plurality of latches (or plurality of page buffers) that are integrated with the memory circuit device. During programming, a page of data is externally supplied to the NAND device and is stored in the page buffer. From the page buffer, the data is then stored in the NAND cells. Reading of the integrated memory circuit device causes data from a page of the memory cells to be read and stored in a page of latches. Thereafter, the contents of the page of latches are read, typically in a serial manner from the integrated memory circuit device.

In contrast, in a NOR mode of operation, different bytes within the NOR array can be randomly accessed, read or programmed. The difference in operation between these two types of modes of operation is that typically, a NOR operation for random access read or program of a small amount of data is faster compared to a NAND program or read operation. However, for a page of serial data, NAND operation of program or read, which requires 2–7 usec of overhead, is faster (on a per byte basis) than compared to a NOR mode of operation.

A NOR memory device emulating the operation of a NAND device is disclosed in U.S. Pat. No. 6,469,955, whose disclosure is incorporated by reference in its entirety.

SUMMARY OF THE INVENTION

In the present invention, an integrated circuit memory device is capable of operating in either a NAND mode or in a NOR mode. The device comprises an array of floating gate memory cells arranged in a NOR configuration, and electrically coupled to a respective plurality of word lines and a plurality of bit lines. A plurality of sub-page buffers are electrically coupled to the plurality of bit lines. A first bus is connected to the device. A first control circuit is coupled to the first bus and to the plurality of sub-page buffers for controlling the operation of the device in the NAND mode. A second bus is connected to the device. A second control circuit is coupled to the first and second buses for controlling the operation of the device in the NOR mode.

BRIEF DESCRIPTION OF THE DRAWINGS

FIG. 1 is a top view showing the pin out assignment of an integrated circuit memory device in accordance with the present invention.

DETAILED DESCRIPTION OF THE INVENTION

Figure 2:
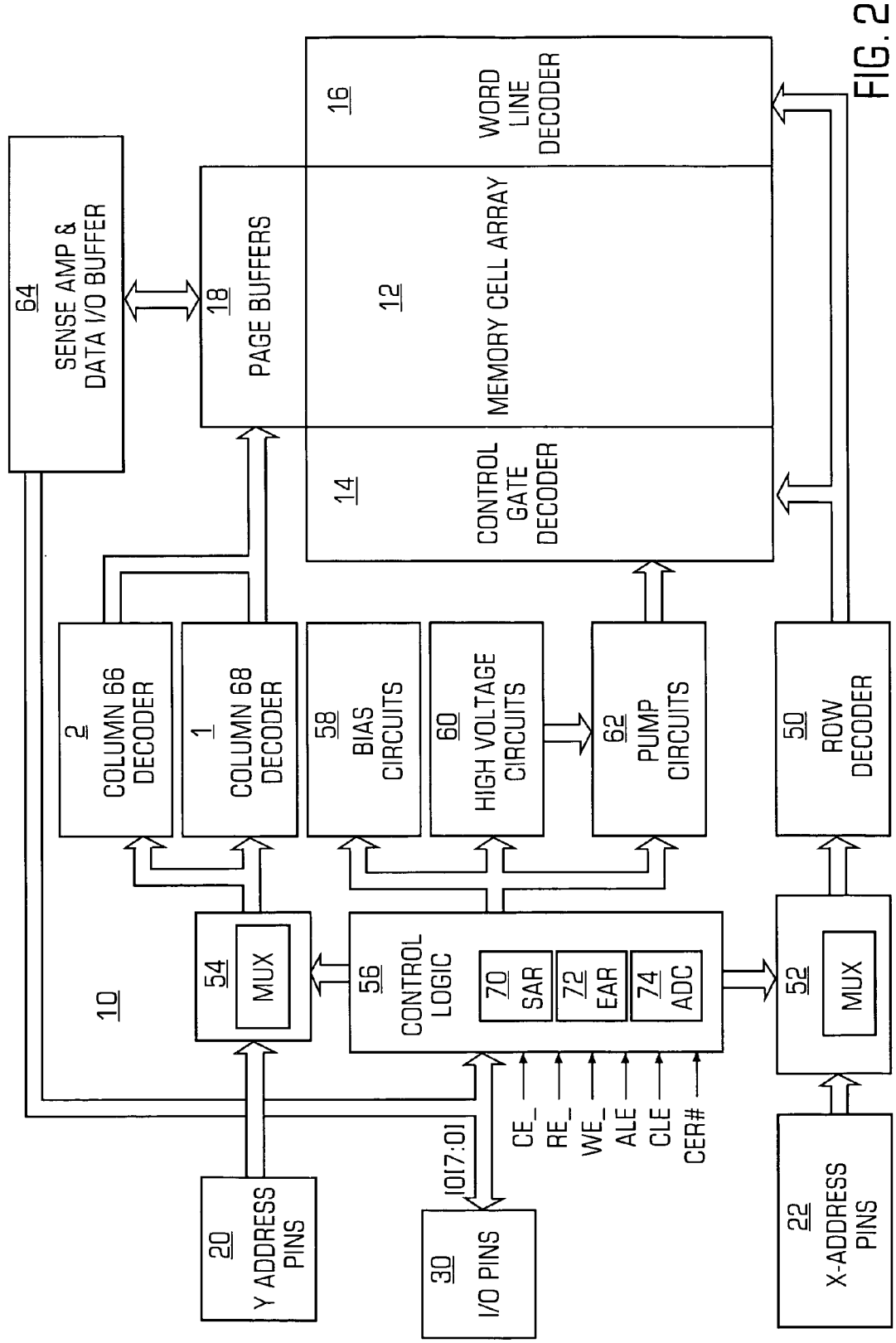
FIG. 2 is a schematic block diagram of the integrated circuit memory device of the present invention.

The present invention is an integrated circuit memory device that is capable of operating in either a NAND mode or a NOR mode. It is an improvement over the device disclosed in U.S. Pat. No. 6,469,955, whose disclosure is incorporated by reference in its entirety. Specifically, in the preferred embodiment, the present invention is encapsulated in a 44 pin standard TSOP package whose top view is shown in FIG. 1. The pin assignment for the device 10 is as follows:

| Pin No. | Function |
| --- | --- |
| 1. | Vss or ground; |
| 2. | CLE—which is a control signal used during NAND operation; |
| 3. | ALE—another control signal used in NAND operation; |
| 4. | WE#—used in NAND/NOR operation; |
| 5. | WP#—used in NAND/NOR operation; |
| 6–17. | A11–A0—address signals used in NOR operation; |
| 18–21. | I/O 0–3 used in NAND/NOR operation; |
| 22. | Vss or ground; |
| 23. | VCCQ—power supply for output driver; |
| 24–27. | I/O 4–7 used in NAND/NOR operation; |
| 28–38. | A12–A22 further address pins used in NOR operation; |
| 39. | CER# used in NOR operation; |
| 40. | SE#—used in NAND/NOR operation; |
| 41. | R/B#—used in NAND/NOR operation; |
| 42. | RE#—used in NAND/NOR operation; |
| 43. | CE#—used in NAND operation; |
| 44. | VCC or power; |

Referring to FIG. 2, there is shown a schematic block level diagram of the integrated circuit memory device 10 of the present invention. With the exception of the Y address pins 20, the X address pins 22, the CER# buffer, and the multiplexers in each of the Y Address Buffer 54 and X Address Buffer 52, the schematic diagram is fully disclosed in U.S. Pat. No. 6,469,955. The multiplexer in each of the Y Address Buffer 54 and the X Address Buffer 52 determines whether the address signals from the X and Y address pins 22, and 20, respectively are supplied to the Row and Column decoders 50 and 66/68, respectively, (during NOR mode of operation) or whether the address signals from the Control Logic 56 (which receives the address signals from the I/O pins 30) are supplied to the Row and Column decoders 50 and 66/68, respectively (during NAND mode of operation). The selection of whether the device 10 is in the NOR mode of operation or NAND mode of operation is determined by the CE# and CER# signals. When the CER# signal goes low, the address from the X & Y address pins 22 and 20, respectively are supplied to the Row and Column decoders 50 and 66/68. When the CE# signal goes low, the address from the ADC 74 in the control logic 56 are supplied to the Row and Column decoders 50 and 66/68.

The integrated circuit memory device 10 comprises a memory cell array 12 of floating gate memory cells of the type such as those disclosed in U.S. Pat. No. 5,768,215, whose disclosure is incorporated by reference in its entirety, or U.S. Pat. No. 5,668,757, whose disclosure is also incorporated by reference in its entirety. Other types of split gate or stacked gate cells can also be used. The array of memory cells 12 is arrange in a NOR configuration and the cells are electrically coupled to a respective plurality of word lines and a plurality of bit lines or column lines. A plurality of sub-page buffers 18 are electrically coupled to the plurality of bit lines. A word line decoder 16 is to one side of the array 10 and decodes the row address supplied thereto and activates the appropriate word lines of the memory cell array 12. A control gate decoder 14 is to the other side of the array 12 and also receives the row address signals and selects the appropriate control gate lines for the memory cell array 12. A first and second column decoder 66 and 68 receive respectively the column address from the Y address buffer 54 and controls the page buffers 18 accordingly. A control logic circuit 56 controls a bias circuit 58 and a high voltage generating circuit 60 and a charge pump circuit 62 which activates the appropriate control gate lines that are controlled by the control gate decoder 14. The control logic 56 also controls the X address buffer 52 and the Y address buffer 54. The X address buffers 52 receive the X address signals from the X address pins 22, which are decoded by the row decoder 50. A sense amplify and data I/O buffer 64 is coupled to the page buffer 18 and to the I/O pins 30. Control signals, such as CE#, RE#, and CER# etc., are also supplied to the control logic 56. Finally, the X address pins 22 and the Y address pins 20 are connected externally to the device 10 and receive the address signals from external to the device 10.

As disclosed in U.S. Pat. No. 6,469,955, the device 10 can operate in a NAND mode. In a NAND mode of operation, the power supplies are supplied to pins 1, 22, 23 and 44. The control pins to pins 2, 3, 4, 5, 42, 43 and 41 are activated. The I/O pins 30 supplying data and address to pins 18–21 and 24–27 are multiplexed for data and address during the command phase in accordance with the NAND protocol. In the programming mode, data is supplied to the page buffer 18 and is stored therein one page at a time. After a page of data is loaded in the page buffer 18, the data from the page buffer 18 is then used to program the memory cells in the memory cell array 12. In the read mode, data from the memory cell array 12 are read out in a page mode fashion and stored in the page buffer 18. Thereafter, the data from the page buffer 18 is read out to the I/O pins 30 serially. In this mode of operation, pins 6–17 and 28–38 are not used. In addition, pin 39 is not selected. Pin 40, which is SE#, is a spare array select pin. During a NAND read operation, sense amplifier 48SA (shown in FIG. 3C of U.S. Pat. No. 6,469,955) is used.

The device 10 can also operate in a NOR mode. In a NOR mode of operation, X and Y addresses are supplied on the address signals supplying pins 7–17 and 6, 28–38, respectively. During programming, pins 18–21 and 24–27 are used to supply data to the device 10. Power is supplied to pins 1, 22, 23 and 44. Control pins 4, 5, 41, 42 and 39 are activated. The spare array select pin SE# 40 may also be used. In programming, data supplied on I/O pins 18–21 and 24–27 are supplied to the data I/O buffer 64. The control logic 56 receives the address signals supplied on the pins 6–17 and 28–38 and multiplexes them into the X and Y address buffers 52 and 54, respectively. From there, the X address signals are decoded by the row decoder 50, while the Y address signals are decoded by the column decoders 66 or 68 and supplied to the page buffer. Those addresses are then used by the control circuit 56 to write or program the data in the I/O Buffer 64 into the addresses specified. In a read mode of operation, the address is specified in the X and Y address buffers 52 and 54, respectively, are read out from the memory cell array 12 to the sense amplifying data buffer 64 and supplied to the IO pins 18–21 and 24–27. During a NOR read mode, the sense amplifier 48NA (shown in FIG. 3C of U.S. Pat. No. 6,469,955) is used.

From the foregoing, it can be seen that other operations are also possible with the device 10 of the present invention. Thus, for example, the device 10 can be used in a NAND programming mode as described hereinabove, and read in a NOR mode. In that event, the "fast" programming capability of NAND operation is coupled with the random accessibility of NOR read operation.

Alternatively, the device 10 can also be used in a NOR programming mode with NAND fast read mode. The NOR programming mode can be used to program only selected bytes without the need to program an entire page of data. The NAND read mode achieves fast readout capability.

In the operation of the various modes, the control signals operate as follows. While in NOR mode of operation, the NOR chip enable pin CER#, pin number 39, is at an active low level and the NAND chip enable pin CE# (pin 43) is at an inactive high level. When CER# is low, both multiplexers in X address buffer 52 and Y address buffer 54 will select X and Y address inputs instead of address outputs from the ADC counter 74 of the control logic 56 which is used in NAND sequential read operation. The non-volatile sense amplifier 48 NA is selected for sensing and a multiplexer in FIG. 3C of U.S. Pat. No. 6,469,955 routes the output of the nonvolatile sense amplifier labeled CSAOUTD to the IO pad 30. Other circuitry in the read path include column decoder 66, column decoder 68 and row decoder 50 are the same as used in the NAND sequential read.

During a NOR program and erase operation, pin CER# is at an active low level. During the command input phase, data is entered through the IO pins 18–21 and 24–27 and addresses are entered through the address pins 6–17 and 28–38. The addresses are multiplexed and stored into the X address buffers 52 and Y address buffers 54. During the execution phase control logic block 56 will generate control and timing signals at the high voltage circuit to write (program or erase) to the selected memory cells selected by the input addresses.

From the foregoing, it can be seen that the integrated memory device 10 is extremely versatile and capable of operating in either NAND mode or in a NOR mode. Further flexibility may be seen by having the array 12 of memory cells being partitioned by the user into two subarrays. One of the subarrays is operable in only the NAND mode while the second subarray is operable only in the NOR mode. The user can configure the memory cell array 12 into the two partitions with their respective modes of operation. The addressing for each of the subarrays would be determined by the limits of the block erase address which is the X address minus the three (3) least significant bits.

What is claimed is:

1. An integrated circuit memory device capable of operating either in a NAND mode or in a NOR mode of operation, said device comprising:

an array of floating gate memory cells arranged in a NOR configuration, and electrically coupled to a respective plurality of word lines and a plurality of bit lines;

a plurality of sub-page buffers electrically coupled to said plurality of bit lines for storing data externally supplied to said device to be programmed into said memory cells coupled to said plurality of bit lines;

a programming control circuit coupled to said plurality of sub-page buffers for initiating a programming operation to program data sequentially from one sub-page buffer into an associated sub-page of memory cells until data from said plurality of sub-page buffers are programmed into said plurality of sub-page memory cells;

a first bus for supplying data and address to said device for programming in said NAND mode;

a second bus for supplying a read address to said device for reading in said NOR mode; and a read control circuit including sense amplifier for reading data stored in said array at said read address and for outputting said data from said device.

2. The device of claim 1 wherein said read control circuit is coupled to said plurality of sub-page buffers for initiating a read operation to read data from a first sub-page of memory cells into a first sub-page buffer, and for initiating a read operation to read data from said first sub-page buffer to external to said integrated circuit memory device, while simultaneously for initiating a read operation to read data from a second sub-page of memory cells into a second sub-page buffer.

3. The device of claim 1 wherein each of said plurality of sub-pages of memory cells comprises a plurality of non-adjacent evenly spaced bit lines with memory cells coupled thereto, with said plurality of sub-pages of memory cells interleaving one another.

4. The device of claim 3 wherein each sub-page buffer is associated with a plurality of adjacent bit lines; and
a column selection circuit for selecting a sub-page buffer to one of said plurality of adjacent bit lines.

5. The device of claim 4 wherein each sub-page buffer is associated with two bit lines.

6. The device of claim 5 wherein each sub-page buffer further comprises:
a latch;
a reset circuit coupled to said latch; and
a switch for connecting to said latch to said column selection circuit.

7. An integrated circuit memory device capable of operating in either a NAND mode or a NOR mode of operation, said device comprising:
an array of floating gate memory cells arranged in a NOR configuration, and electrically coupled to a respective plurality of word lines and a plurality of bit lines;
a plurality of sub-page buffers electrically coupled to said plurality of bit lines for storing data read from said memory cells coupled to said plurality of bit lines;
a read control circuit coupled to said plurality of sub-page buffers for initiating a read operation to read data from a first sub-page of memory cells into a first sub-page buffer, and for initiating a read operation to read data from said first sub-page buffer to extend to said device;
a first bus for supplying address to said device for reading data from said first sub-page in said NAND mode;
a second bus for supplying a programming address to said device for programming in said NOR mode; and
a programming control circuit coupled to said second bus for programming said array at said programming address.

8. The device of claim 7 wherein said first bus supplies data for programming in said NOR mode.

9. The device of claim 7 wherein each of said plurality of sub-pages of memory cells comprises a plurality of non-adjacent evenly spaced bit lines with memory cells coupled thereto, with said plurality of sub-pages of memory cells interleaving one another.

10. The device of claim 9 wherein each sub-page buffer is associated with a plurality of adjacent bit lines; and
a column selection circuit for selecting a sub-page buffer to one of said plurality of adjacent bit lines.

11. The device of claim 10 wherein each sub-page buffer is associated with two bit lines.

12. The device of claim 1 wherein each sub-page buffer further comprises:
a latch;
a reset circuit coupled to said latch; and
a switch for connecting to said latch to said column selection circuit.

13. An integrated memory device capable of operating in either a NAND mode or in a NOR mode, said device comprising:
an array of floating gate memory cells arranged in a NOR configuration, and electrically coupled to a respective plurality of word lines and a plurality of bit lines;
a plurality of sub-page buffers electrically coupled to said plurality of bit lines;
a first bus connected said device;
a first control circuit coupled to said first bus and to said plurality of sub-page buffers for controlling the operation of said device in said NAND mode;
a second bus connected to said device; and
a second control circuit coupled to said first and second bus for controlling the operation of said device in said NOR mode.

14. The device of claim 13 wherein said first bus supplies data and address to said device for programming in said NAND mode.

15. The device of claim 13 wherein said first bus supplies data and said second bus supplies address to said device for programming in said NOR mode.

16. The device of claim 13 wherein said first bus supplies address to said device and for outputting data from said device for reading in said NAND mode.

17. The device of claim 13 wherein said first bus supplies data from said device and said second bus supplies address to said device for reading in said NOR mode.

18. The device of claim 13 wherein said first control circuit further comprising
a programming control circuit to store data sequentially from said first bus to one sub-page buffer and to program data sequentially from said one sub-page buffer into an associated sub-page of memory cells until data from said plurality of sub-page buffers are programmed into said plurality of sub-page memory cells;
a read control circuit to read data from a first sub-page of memory cells into a first sub-page buffer, and for initiating a read operation to read data from said first sub-page buffer to external to said device.

19. The device of claim 13 wherein said array is divided into a first sub-array and a second sub-array, wherein said first sub-array is operable in said NAND mode, and said second sub-array is operable in said NOR mode.

20. The device of claim 19 wherein said division of said array between said first sub-array and said second sub-array is user configurable.

* * * * *